United States Patent
Li et al.

(10) Patent No.: US 10,747,075 B2
(45) Date of Patent: Aug. 18, 2020

(54) DISCHARGE CIRCUIT, DISCHARGE METHOD AND DISPLAY DEVICE

(71) Applicants: BOE Technology Group Co., Ltd., Beijing (CN); Hefei BOE Optoelectronics Technology Co., Ltd., Hefei (CN)

(72) Inventors: Kun Li, Beijing (CN); Dayu Zhang, Beijing (CN)

(73) Assignees: BOE Technology Group Co., Ltd., Beijing (CN); Hefei BOE Optoelectronics Technology Co., Ltd., Hefei, Anhui (CN)

( * ) Notice: Subject to any disclaimer, the term of this patent is extended or adjusted under 35 U.S.C. 154(b) by 109 days.

(21) Appl. No.: 16/180,151

(22) Filed: Nov. 5, 2018

(65) Prior Publication Data

US 2019/0235326 A1    Aug. 1, 2019

(30) Foreign Application Priority Data

Jan. 29, 2018    (CN) .......................... 2018 1 0085781

(51) Int. Cl.
| | |
|---|---|
| *G02F 1/13* | (2006.01) |
| *G09G 3/36* | (2006.01) |
| *G02F 1/1362* | (2006.01) |
| *H01L 27/02* | (2006.01) |
| *H02H 9/04* | (2006.01) |

(52) U.S. Cl.
CPC ..... *G02F 1/136204* (2013.01); *G09G 3/3648* (2013.01); *G09G 3/3685* (2013.01); *H01L 27/0285* (2013.01); *H02H 9/046* (2013.01); *G09G 2330/04* (2013.01)

(58) Field of Classification Search
None
See application file for complete search history.

(56) References Cited

U.S. PATENT DOCUMENTS

| | | | | |
|---|---|---|---|---|
| 2009/0085902 | A1* | 4/2009 | Yamamoto | G09G 3/3648 345/211 |
| 2019/0340995 | A1* | 11/2019 | Miyata | G09G 3/36 |

FOREIGN PATENT DOCUMENTS

CN    106356033 A    1/2017

* cited by examiner

*Primary Examiner* — Dedei K Hammond
(74) *Attorney, Agent, or Firm* — Banner & Witcoff, Ltd.

(57) ABSTRACT

A discharge circuit, a discharge method, and a display device are disclosed. The discharge circuit includes a switch sub-circuit and a discharge control sub-circuit. The switch sub-circuit is configured to: receive a control signal, in which the control signal is determined by a working state of a display device, output a first voltage signal as a discharge input signal when the control signal has a first polarity, and output a second voltage signal as the discharge input signal when the control signal has a second polarity; and the discharge control sub-circuit is configured to: receive the discharge input signal from the switch sub-circuit; and generate and output a discharge control signal according to the discharge input signal.

20 Claims, 5 Drawing Sheets

DISCHARGE CIRCUIT, DISCHARGE METHOD AND DISPLAY DEVICE

CROSS-REFERENCE TO RELATED APPLICATION

The present application claims priority of the Chinese Patent Application No. 201810085781.7 filed on Jan. 29, 2018, the disclosure of which is incorporated herein by reference in its entirety as part of the present application.

TECHNICAL FIELD

The embodiments of the present disclosure relate to a discharge circuit, a discharge method, and a display device.

BACKGROUND

With development of liquid crystal display (LCD) technology, thin-film transistor liquid crystal displays (TFT-LCDs) are widely applied in LCD TVs, mobile phones, computers and other electronic products due to their advantages of high resolution, power saving, light and thin body, etc.

When the TFT-LCD works normally, each pixel must be charged so as to display an image. After shutdown, charges remaining in pixels disappear slowly, resulting in an after-image phenomenon of the TFT-LCD, and even causing liquid crystal polarization.

SUMMARY

At least one embodiment of the present disclosure discloses a discharge circuit, comprising: a switch sub-circuit and a discharge control sub-circuit, where the switch sub-circuit is configured to: receive a control signal, in which the control signal is determined by a working state of a display device, output a first voltage signal as a discharge input signal in a case where the control signal has a first polarity, and output a second voltage signal as the discharge input signal in a case where the control signal has a second polarity; and the discharge control sub-circuit is electrically connected with the switch sub-circuit and is configured to: receive the discharge input signal from the switch sub-circuit, and generate and output a discharge control signal according to the discharge input signal.

For example, the discharge circuit according to an embodiment of the present disclosure further comprises a detection sub-circuit, the detection sub-circuit is configured to detect the working state of the display device, and generate and output the control signal according to the working state of the display device.

For example, in the discharge circuit according to an embodiment of the present disclosure, the switch sub-circuit comprises a first output end and a second output end; the discharge control sub-circuit is electrically connected with the second output end of the switch sub-circuit; in the case where the control signal has the first polarity, the switch sub-circuit is in a first switch state, and the second output end of the switch sub-circuit outputs the first voltage signal as the discharge input signal; and in the case where the control signal has the second polarity, the switch sub-circuit is in a second switch state, and the second output end of the switch sub-circuit outputs the second voltage signal as the discharge input signal.

For example, in the discharge circuit according to an embodiment of the present disclosure, in the case where the control signal has the first polarity, the switch sub-circuit is further configured to output the first voltage signal to the discharge control sub-circuit; in the case where the control signal has the second polarity, the switch sub-circuit is configured to output the second voltage signal to the discharge control sub-circuit and is also configured to control a timing controller and/or a source driver to stop working; and a level of the first voltage signal is a first-type level, and a level of the second voltage signal is a second-type level.

For example, in the discharge circuit according to an embodiment of the present disclosure, in the case where the control signal has the first polarity, the switch sub-circuit is also configured to output the second voltage signal to the timing controller and/or the source driver through the first output end.

For example, in the discharge circuit according to an embodiment of the present disclosure, the switch sub-circuit comprises a switch element; the switch element comprises a control end, an input end, the first output end and the second output end; the control end of the switch element is configured to receive the control signal; the input end of the switch element is configured to receive the second voltage signal; the first output end of the switch element is electrically connected with the timing controller and/or the source driver; in the case where the control signal has the first polarity, the switch element electrically connects the input end and the first output end under control of the control signal; and in the case where the control signal has the second polarity, the switch element electrically connects the input end and the second output end under the control of the control signal.

For example, in the discharge circuit according to an embodiment of the present disclosure, the switch element is a relay element, the relay element comprises a moving contact, a first stationary contact and a second stationary contact; the moving contact is the input end of the switch element; the first stationary contact is the first output end of the switch element; and the second stationary contact is the second output end of the switch element.

For example, in the discharge circuit according to an embodiment of the present disclosure, the discharge control sub-circuit comprises a NOT gate; an input end of the NOT gate is configured to receive the discharge input signal, and an output end of the NOT gate is configured to output the discharge control signal.

For example, in the discharge circuit according to an embodiment of the present disclosure, the discharge control sub-circuit comprises a NAND gate; a first input end of the NAND gate is configured to receive a logic input voltage signal, a second input end of the NAND gate is configured to receive the discharge input signal, and an output end of the NAND gate is configured to output the discharge control signal.

For example, in the discharge circuit according to an embodiment of the present disclosure, the working state of the display device comprises a shutdown state, a sleep state and a display state; in the display state, the detection sub-circuit is configured to generate and output the control signal having the first polarity; and in the shutdown state and the sleep state, the detection sub-circuit is configured to generate and output the control signal having the second polarity.

An embodiment of the present disclosure further provides a display device, comprising the discharge circuit according to any one of the above embodiments.

For example, the display device according to an embodiment of the present disclosure further comprises a display panel and a gate driver, the display panel comprises a plurality of pixel units; the discharge circuit is configured to generate and output the discharge control signal to the gate driver; and the gate driver is configured to output a first group of driving signals to the plurality of pixel units respectively in a case where a level of the discharge control signal is a first-type level, so as to control the plurality of pixel units to perform neutralizing discharge.

For example, in the display device according to an embodiment of the present disclosure, the gate driver is further configured to output a second group of driving signals in scanning manner in a case where the level of the discharge control signal is a second-type level, so as to control the plurality of pixel units to display normally.

For example, the display device according to an embodiment of the present disclosure further comprises a timing controller and/or a source driver, the timing controller and/or the source driver is connected with the discharge circuit; in the case where the control signal has the first polarity, the discharge circuit is configured to control the timing controller and/or the source driver to work normally; and in the case where the control signal has the second polarity, the discharge circuit is configured to control the timing controller and/or the source driver to stop working.

An embodiment of the present disclosure further provides a discharge method, comprising: acquiring a control signal, in which the control signal is determined by a working state of a display device; generating a discharge input signal through a switch sub-circuit according to the control signal, in which the discharge input signal is a first voltage signal in a case where the control signal has a first polarity and the discharge input signal is a second voltage signal in a case where the control signal has a second polarity; and generating and outputting a discharge control signal through a discharge control sub-circuit according to the discharge input signal.

For example, in the discharge method according to an embodiment of the present disclosure, acquiring the control signal comprises: detecting the working state of the display device, and generating the control signal according to the working state of the display device.

For example, the discharge method according to an embodiment of the present disclosure further comprises: controlling a timing controller and/or a source driver to stop working in the case where the control signal has the second polarity.

For example, the discharge method according to an embodiment of the present disclosure further comprises: in the case where the control signal has the first polarity, outputting the second voltage signal to the timing controller and/or the source driver to control the timing controller and/or the source driver to work normally, in which in the case where the control signal has the first polarity, a level of the first voltage signal is a first-type level, and a level of the discharge control signal is a second-type level; and in the case where the control signal has the second polarity, a level of the second voltage signal is the second-type level, and the level of the discharge control signal is the first-type level.

For example, in the discharge method according to an embodiment of the present disclosure, generating and outputting the discharge control signal through the discharge control sub-circuit according to the discharge input signal comprises: obtaining the discharge control signal by inverting the discharge input signal.

For example, the discharge method according to an embodiment of the present disclosure further comprises: determining whether a level of the discharge control signal is a first-type level or a second-type level; outputting a first group of driving signals to control all pixel units in a display device to perform neutralizing discharge in a case where the level of the discharge control signal is the first-type level; and outputting a second group of driving signals to control all the pixel units in the display device to display normally in a case where the level of the discharge control signal is the second-type level.

BRIEF DESCRIPTION OF THE DRAWINGS

In order to clearly illustrate the technical solutions of the embodiments of the disclosure, the drawings of the embodiments will be briefly described in the following; it is obvious that the described drawings are only related to some embodiments of the disclosure and thus are not limitative to the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

In order to make the following description of the embodiments of the present disclosure clear and concise, the present disclosure omits detailed descriptions of known functions and known components.

Currently, a shutdown image removal (XON) function on a driver integrated circuit of the TFT-LCD is mainly adopted to solve an afterimage problem. The XON function mainly refers to that: in a shutdown process, when a logic input voltage signal VDD (e.g., 2.5V) drops to a certain value (e.g., 2V), the XON function is switched on, namely an XON signal is generated; and the XON signal controls thin film transistors in pixel units to be turned on, and then the pixel units start to discharge.

Figure 1:
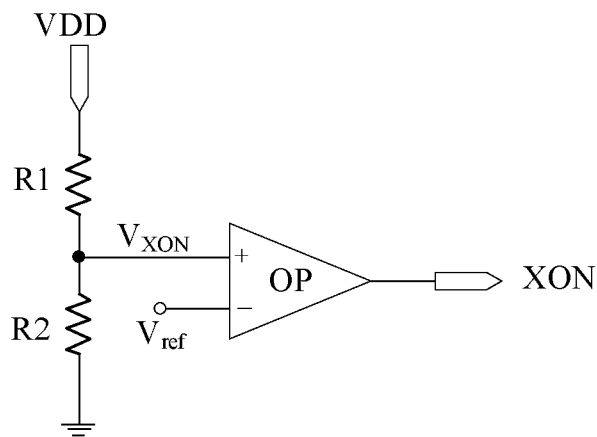
FIG. 1 is a schematic diagram of an XON signal generating circuit.

FIG. 1 is a schematic diagram of an XON signal generating circuit. As shown in FIG. 1, an XON signal generating circuit includes a voltage comparator OP, a first resistor R1 and a second resistor R2. An inverting input end of the voltage comparator OP is configured to receive a reference voltage signal $V_{ref}$, and a non-inverting input end of the voltage comparator OP is configured to receive an XON voltage signal $V_{XON}$. The XON voltage signal $V_{XON}$ is obtained by dividing a voltage from the logic input voltage signal VDD through the first resistor R1 and the second resistor R2. When a display panel works normally, a power supply terminal provides the logic input voltage signal VDD for the display panel. In this case, $V_{XON} > V_{ref}$, so the voltage comparator OP outputs a high level signal. That is to say, at this point, the XON signal is a high level signal, and signals at output ends of the gate driver are outputted normally, namely one output end of the gate driver outputs a first driving signal VGH, and the remaining output ends of the gate driver output second driving signals VGL, so as to control the t to work normally.

In the shutdown process, the power supply terminal does not output the logic input voltage signal VDD to the display panel again, so the logic input voltage signal VDD starts to power down. When $V_{XON} < V_{ref}$, the voltage comparator OP outputs a low level signal, namely at this point, the XON signal is a low level signal. When the XON signal is a low level signal, as for a chip on glass (COG) product, the XON signal is transmitted to a gate driver; after receiving the XON signal, the gate driver is controlled to output ON signals so as to simultaneously turn on all the thin film transistors in the display panel; charges in pixels flow out through the thin film transistors; and because the charges in different pixels have opposite polarities, the charges in the pixels are neutralized, and finally the purpose of eliminating shutdown afterimage can be achieved. As for a gate driver on array (GOA) product, after receiving the XON signal, a level shifter in a gate driver pulls up second driving signals VGL outputted by output ends of the gate driver to a first driving signal VGH (in the case of normal display, at a certain scanning moment, only one output end outputs the first driving signal VGH, and the remaining output ends output the second driving signals VGL), therefore, all the thin film transistors in the display panel are turned on simultaneously; charges in pixels flow out through the thin film transistors; and because the charges in different pixels have opposite polarities, the charges in the pixels are neutralized, and finally the purpose of eliminating shutdown afterimage can be achieved. For instance, the second driving signal VGL is an OFF voltage signal of a thin film transistor, and the second driving signal VGL is generally between −10V and 0V; and the first driving signal VGH is an ON voltage signal of the thin film transistor, and the first driving signal VGH is generally more than 10V.

Currently, the XON function has certain defects (for example, insufficient discharge time, the thin film transistor being turned off again after being turned on, etc.), resulting in that the pixel units are not completely discharged, and then the display panel will still have a shutdown afterimage phenomenon. On the other hand, the XON function can only perform pixel discharge operation at the moment of shutdown, and as for oxide thin film transistors, because of their good charge retention performance, the conventional XON function cannot completely neutralize the residual charges in the pixels. Therefore, the shutdown afterimage phenomenon is more likely to occur in the display panel using the oxide thin film transistors.

At least one embodiment of the present disclosure provides a discharge circuit, a discharge method and a display device, which can effectively prolong discharge time of pixel units, can perform an operation of neutralizing discharge in a shutdown or sleep state, and meanwhile, can avoid a phenomenon that transistors are turned off again after being turned on, thereby effectively releasing residual charges on pixel electrodes in the pixel units and reducing or eliminating a shutdown afterimage phenomenon.

It should be noted that in the present disclosure, a phase of a first-type level and a phase of a second-type level are opposite. For instance, the first-type level may be a low level and the second-type level signal may be a high level. An absolute value of the first-type level and an absolute value of the second-type level may be same or different, and the present disclosure is not limited thereto. A control signal with a first polarity may control a switch sub-circuit to be in a first switch state, and the control signal with a second polarity may control the switch sub-circuit to be in a second switch state. For instance, in some embodiments, a phase of the control signal with the first polarity and a phase of the control signal with the second polarity are opposite, and an absolute value of the control signal with the first polarity and an absolute value of the control signal with the second polarity may be same or different. For instance, in the case where the control signal has the first polarity, a level of the control signal is the first-type level; and in the case where the control signal has the second polarity, a level of the control signal is the second-type level.

Several embodiments of the present disclosure are described in details below, but the present disclosure is not limited to these specific embodiments.

Figure 2:
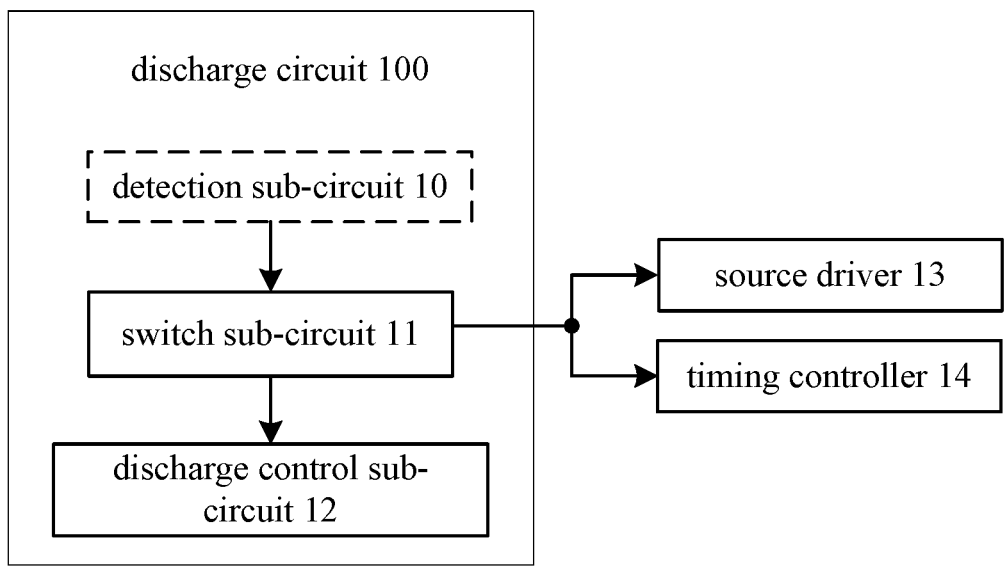
FIG. 2 is a schematic block diagram of a discharge circuit provided by an embodiment of the present disclosure.
Figure 3:
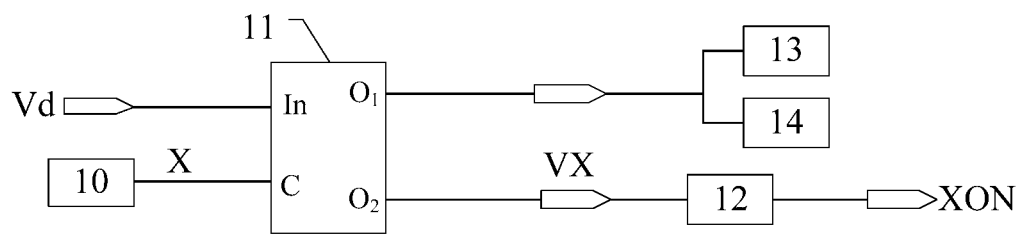
FIG. 3 is a schematic structural diagram of a discharge circuit provided by an embodiment of the present disclosure.

FIG. 2 is a schematic block diagram of a discharge circuit provided by an embodiment of the present disclosure; FIG. 3 is a schematic structural diagram of a discharge circuit provided by an embodiment of the present disclosure.

For instance, as shown in FIGS. 2 and 3, a discharge circuit 100 provided by an embodiment of the present disclosure comprises a switch sub-circuit 11 and a discharge control sub-circuit 12. The switch sub-circuit 11 is configured to: receive a control signal X, in which the control signal X is determined by a working state of a display device; output a first voltage signal as a discharge input signal VX of the discharge control sub-circuit 12 in a case where the control signal X has a first polarity; and output a second voltage signal Vd as the discharge input signal VX of the discharge control sub-circuit 12 in a case where the control signal X has a second polarity. The discharge control sub-circuit 12 is electrically connected with the switch sub-circuit 11, and the discharge control sub-circuit 12 is configured to: receive the discharge input signal VX from the switch sub-circuit 11; and generate and output a discharge control signal XON according to the discharge input signal VX.

For instance, as shown in FIG. 2, the discharge circuit 100 may further comprise a detection sub-circuit 10. The detection sub-circuit 10 is configured to detect the working state of the display device and generate and output the control signal X according to the working state of the display device.

For instance, as shown in FIG. 3, the switch sub-circuit 11 may include a first output end $O_1$ and a second output end $O_2$. The discharge control sub-circuit 2 is electrically connected with the second output end $O_2$ of the switch sub-circuit 11. In the case where the control signal X has the first polarity, the switch sub-circuit 11 is in a first switch state, and the second output end $O_2$ of the switch sub-circuit 11 outputs the first voltage signal as the discharge input signal VX; and in the case where the control signal X has the second polarity, the switch sub-circuit 11 is in a second switch state, and the second output end $O_2$ of the switch sub-circuit 11 outputs the second voltage signal Vd as the discharge input signal VX.

For instance, in some examples, in the case where the control signal X has the first polarity, the first output end $O_1$ of the switch sub-circuit 11 may output the second voltage signal Vd.

For instance, as shown in FIG. 3, the switch sub-circuit 11 may further comprise an input end In. In a case where the switch sub-circuit 11 is in the first switch state, the input end In of the switch sub-circuit 11 is electrically connected with the first output end $O_1$ of the switch sub-circuit 11; and in the case where the switch sub-circuit 11 is in the second switch state, the input end In of the switch sub-circuit 11 is electrically connected with the second output end $O_2$ of the switch sub-circuit 11.

For instance, the discharge circuit provided by the present disclosure may be applied to COG products, GOA products, and the like.

For instance, the control signal X may be provided by an external circuit of the display device, that is, the detection sub-circuit 10 may be disposed outside the display device, for example, may be integrated into a central processing unit (CPU). Moreover, for instance, the control signal X may also be provided by an integrated circuit chip inside the display device, that is, the detection sub-circuit 10 may be disposed in the integrated circuit chip of the display device; or the control signal X may also be generated by a processing system in the display device using a triggering method.

For instance, the working state of the display device may include a shutdown state, a sleep state, a display state, etc. In the display state, the detection sub-circuit 10 is configured to generate and output the control signal X having the first polarity; and in the shutdown state and the sleep state, the detection sub-circuit 10 is configured to generate and output the control signal X having the second polarity.

For instance, when the detection sub-circuit 10 detects that the display device is in the display state, the detection sub-circuit 10 can generate and output the control signal X, and the control signal X has the first polarity; and when the detection sub-circuit 10 detects that the display device is in the shutdown state or the sleep state, the detection sub-circuit 10 can generate and output the control signal X, and the control signal X has the second polarity. For instance, the detection sub-circuit 10 can determine the working state of the display device according to an indication signal of the CPU. For instance, when the detection sub-circuit 10 detects that the CPU gives an indication signal for indicating that the display device enters a normal display state, it indicates that the display device is in the display state; and when the detection sub-circuit 10 detects that the CPU gives an indication signal for indicating that the display device enters the shutdown state or the sleep state, it indicates that the display device is in the shutdown state or the sleep state. The indication signal of the CPU can be given, for example, by methods such as physical button, mouse click selection, finger touch selection, or the like.

It should be noted that the working state of the display device may also include a locked state, a standby state, etc. In each working state, the polarity of the control signal X may be set according to actual application. No limitation will be given here in the present disclosure.

For instance, when the detection sub-circuit 10 detects that the display device is in the shutdown state or the sleep state, the detection sub-circuit 10 can generate and output the control signal X, and the discharge control sub-circuit 12 can generate and output the discharge control signal XON to enable the XON function, so as to control the pixel units to perform neutralizing discharge. Therefore, the discharge circuit can enable the XON function before the logic input voltage signal drops to a specific value (e.g., 2V), thereby effectively prolonging the discharge time of the pixel electrodes in the pixel units.

For instance, the detection sub-circuit 10 may be implemented by a hardware circuit. Moreover, for instance, the detection sub-circuit 10 may also be implemented by a signal processor such as a field programmable gate array (FPGA), a digital signal processor (DSP) or a microcontroller unit (MCU). The detection sub-circuit 10, for instance, may include a processor and a memory. The processor executes software programs stored in the memory to achieve the function of detecting the working state of the display device.

For instance, in the case where the control signal X has the first polarity, a level of the control signal X may be a first-type level (e.g., a low level). In the case where the control signal X has the second polarity, a level of the control signal X may be a second-type level (e.g., a high level). According to actual application requirement, the detection sub-circuit 10 can adjust duration of the generated control signal X. For instance, in the case where the control signal X has the second polarity, the duration of the control signal X may be 5 seconds, 10 seconds or the like, namely the duration of the high level signal may be 5 seconds, 10 seconds, etc.

For instance, the control signal X may control duration of the discharge input signal VX and then control duration of the discharge control signal XON. Moreover, for instance, the discharge control signal XON may be controlled by timing sequence, namely pixel discharge may be controlled by the timing sequence, instead of relying solely on the moment of power off. Controlling the discharge pixel by utilization of timing sequence can control the turn-on time of transistors, so as to ensure that the transistors will not be turned off again after being turned on, and hence effectively release the residual charges on the pixel electrodes.

It should be noted that according to a specific structure of the switch sub-circuit 11, in the case where the control signal X has the first polarity, the control signal X may also be a high level signal. In the case where the control signal X has the second polarity, the control signal X is a low level signal. The present disclosure is not limited thererto.

For instance, in the case where the control signal X has the first polarity, the switch sub-circuit 11 is configured to output the second voltage signal Vd to a source driver 13 and/or a timing controller 14 through the first output end $O_1$, so that the display device can achieve the normal display function; and the switch sub-circuit 11 is also configured to output the first voltage signal to the discharge control sub-circuit 12, so as to control the discharge control sub-circuit 12 to stop working, and in this case, the discharge control sub-circuit 12, for instance, may not output the discharge control signal XON or output a discharge control signal XON with a high level, namely the XON function is turned off at this point. In the case where the control signal X has the second polarity, the switch sub-circuit 11 is configured to output the second voltage signal Vd to the discharge control sub-circuit 12, and at this point, the discharge control sub-circuit 12 controls the XON function of the display device to be turned on, so that the display device can achieve the discharge function; and the switch sub-circuit 11 is also configured to output a discharge indication signal to the source driver 13 and/or the timing controller 14, so as to control the source driver 13 and/or the timing controller 14 to stop working.

For instance, the level of the first voltage signal is the first-type level, and the level of the second voltage signal Vd is the second-type level.

For instance, when the switch sub-circuit 11 outputs the first voltage signal to the discharge control sub-circuit 12, it indicates that the display device is just in the normal display state, so the discharge control sub-circuit 12 controls the XON function to be turned off, and the display device performs the normal display operation. When the switch sub-circuit 11 outputs the second voltage signal Vd to the discharge control sub-circuit 12, it indicates that the display device is in the shutdown state or the sleep state, so the discharge control sub-circuit 12 controls the XON function to be turned on, and the display device performs the discharge operation.

For instance, in the case where the control signal X has the first polarity, the first voltage signal is a low level signal, and the second voltage signal Vd outputted to the source driver 13 and/or the timing controller 14 is a high level signal. In the case where the control signal X has the second polarity, the discharge indication signal is a low level signal, and the second voltage signal Vd outputted to the discharge control sub-circuit 12 is a high level signal.

For instance, the first voltage signal may be a scanning indication signal, the first voltage signal indicates that the gate driver of the display device performs a scanning operation according to a preset scanning manner, that is, it indicates that the pixel units of the display device display normally, and at this point, the display device is just in the normal display state.

For instance, the discharge indication signal indicates that the display device is in the discharge state, it indicates that the pixel units of the display device performs neutralizing discharge, and at this point, the display device is in the shutdown state or the sleep state.

For instance, the second voltage signal Vd may be a display voltage signal. The second voltage signal Vd represents a grayscale voltage when the pixel unit in the display device is in the display state, that is, the second voltage signal Vd can control the display brightness of each pixel unit in the display device. For instance, the second voltage signal Vd may be 1.8V, but the present disclosure is not limited thereto. The value of the second voltage signal Vd may be specifically set according to actual application.

For instance, as shown in FIGS. 2 and 3, the switch sub-circuit 11 may include a switch element. The switch element may include a control end C, an input end In, a first output end $O_1$ and a second output end $O_2$. The control end C of the switch element may be electrically connected with the output end of the detection sub-circuit 10, so as to receive the control signal X. The input end In of the switch element is configured to receive the second voltage signal Vd. The first output end $O_1$ of the switch element may be electrically connected with the source driver 13 and the timing controller 14. The second output end $O_2$ of the switch element may be electrically connected with the discharge control sub-circuit 12. When the control signal X has the first polarity, in this case, the level of the control signal X is, for instance, the first-type level, namely the control signal X is a low level signal, and the switch element electrically connects the input end In and the first output end $O_1$ under the control of the control signal X, so that the switch element can transmit the second voltage signal Vd (e.g., high level signal) to the source driver 13 and the timing controller 14, so as to control the display device to achieve the normal display function. At this point, the second output end $O_2$ of the switch element can be floating; alternatively, the second output end $O_2$ can output the first voltage signal (e.g., low level signal) to the discharge control sub-circuit 12.

When the control signal X has the second polarity, at this point, the level of the control signal X is, for instance, the second-type level, that is, the control signal X is a high level signal, and the switch element electrically connects the input end In and the second output end $O_2$ under the control of the control signal X, so that the switch element can transmit the second voltage signal Vd (e.g., high level signal) to the discharge control sub-circuit 12, and the discharge control sub-circuit 12 generates and outputs the discharge control signal XON according to the second voltage signal Vd, so as to control the display device to perform the discharge operation. In this case, the first output end $O_1$ of the switch element can be floating, alternatively, the first output end $O_1$ can output the discharge indication signal (e.g., low level signal) to the source driver 13 and/or the timing controller 14.

Figure 4A:
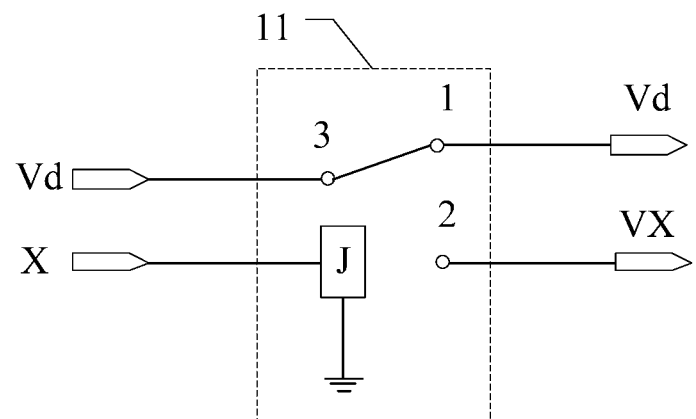
FIG. 4A is a schematic structural diagram illustrating a case where a switch sub-circuit is in a first switch state according to an embodiment of the present disclosure.
Figure 4B:
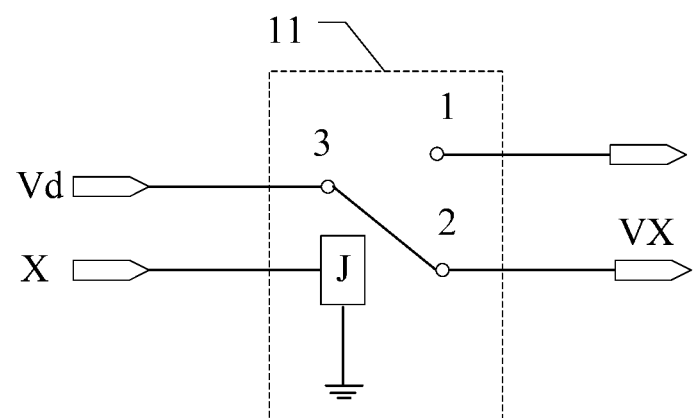
FIG. 4B is a schematic structural diagram illustrating a case where the switch sub-circuit is in a second switch state according to an embodiment of the present disclosure.

FIG. 4A is a schematic structural diagram illustrating a case where a switch sub-circuit is in a first switch state according to an embodiment of the present disclosure; FIG. 4B is a schematic structural diagram illustrating a case where the switch sub-circuit shown in FIG. 4A is in a second switch state.

For instance, in one example, as shown in FIGS. 4A and 4B, the switch element may include a relay element J. The relay element J includes a moving contact 3, a first stationary contact 1 and a second stationary contact 2. The moving contact 3 may be the input end In of the switch element; the first stationary contact 1 may be the first output end $O_1$ of the switch element; and the second stationary contact 2 may be the second output end $O_2$ of the switch element. For instance, the control signal X is used for controlling a coil in the relay element J to be energized or de-energized. When the coil is not energized, the moving contact 3 may be in contact with the first stationary contact 1; and when the coil is energized, the moving contact 3 is in contact with the second stationary contact 2.

For instance, as shown in FIG. 4A, when the control signal X has the first polarity (for instance, when the control signal X is a low level signal), the switch sub-circuit 11 is in the first switch state; under the control of the control signal X, the coil in the relay element J is powered off; the moving contact 3 in the relay element J is electrically connected with the first stationary contact 1; and the second stationary contact 2 in the relay element J is floating. Thus, the relay element J can transmit the second voltage signal Vd to the source driver 13 and the timing controller 14. At this point, the level of the second stationary contact 2 is a low level, namely is a first voltage signal with a low level.

For instance, as shown in FIG. 4B, when the control signal X has the second polarity (for instance, when the control signal X is a high level signal), the switch sub-circuit 11 is in the second switch state; under the control of the control signal X, the coil in the relay element J is powered on; the moving contact 3 in the relay element J is electrically connected with the second stationary contact 2; and the first stationary contact 1 in the relay element J is floating. Thus, the relay element J can transmit the second voltage signal Vd to the discharge control sub-circuit 12. At this time, the level of the first stationary contact 1 is a low level, namely is a discharge indication signal with a low level.

In summary, the relay element J can time-divisionally transmit the second voltage signal Vd to different circuits under the control of the control signal X.

For instance, the relay element J may be various types of relays, such as an electromagnetic relay, a solid state relay, or the like.

Figure 5A:
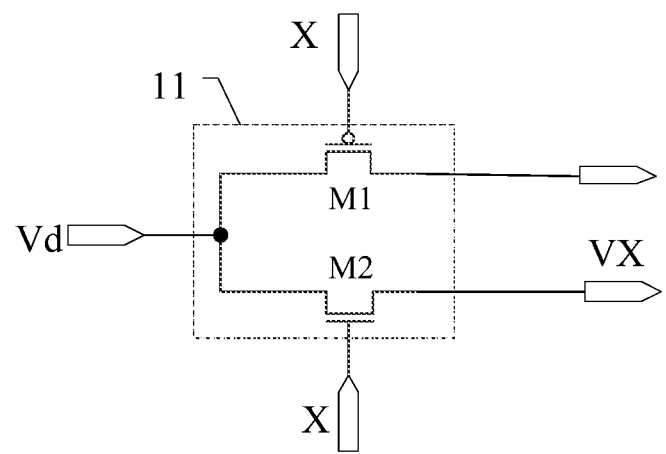
FIG. 5A is a schematic structural diagram of another switch sub-circuit according to an embodiment of the present disclosure.
Figure 5B:
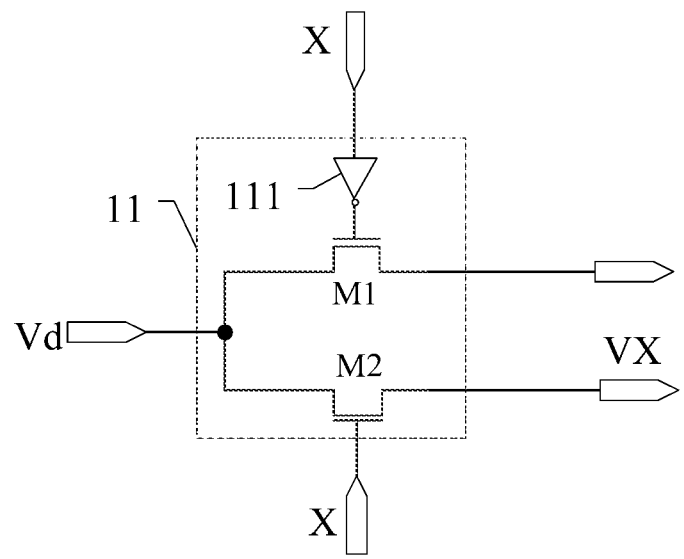
FIG. 5B is a schematic structural diagram of still another switch sub-circuit according to an embodiment of the present disclosure.

FIG. 5A is a schematic structural diagram of another switch sub-circuit according to an embodiment of the present disclosure; FIG. 5B is a schematic structural diagram of still another switch sub-circuit according to an embodiment of the present disclosure.

For instance, as shown in FIG. 5A, the switch element may include a first transistor M1 and a second transistor M2. A control electrode of the first transistor M1 and a control electrode of the second transistor M2 may be the control end C of the switch element; a first electrode of the first transistor M1 and a first electrode of the second transistor M2 may be the input end In of the switch element; a second electrode of the first transistor M1 may be the first output end $O_1$ of the switch element; and a second electrode of the second transistor M2 may be the second output end $O_2$ of the switch element.

For instance, the first electrode of the first transistor M1 is configured to receive the second voltage signal Vd; the second electrode of the first transistor M1 is configured to be electrically connected with the source driver 13 and the timing controller 14; and the control electrode of the first transistor M1 is configured to receive the control signal X. The first electrode of the second transistor M2 is configured to receive the second voltage signal Vd; the second electrode of the second transistor M2 is configured to be electrically connected with the discharge control sub-circuit 12; and the control electrode of the second transistor M2 is configured to receive the control signal X.

For instance, the first transistor M1 and the second transistor M2 both are thin film transistors (TFTs), field-effect transistors (FETs) or other switching elements having the same characteristics.

For instance, a type of the first transistor M1 and a type of the second transistor M2 are opposite. As shown in FIG. 5A, in one example, the first transistor M1 is a P-type transistor, and the second transistor M2 is an N-type transistor. When the control signal X is a low level signal, the first transistor M1 is turned on; the second transistor M2 is turned off; and the second voltage signal Vd is transmitted to the source driver 13 and the timing controller 14 through the first transistor M1. In this case, the level of the second electrode of the second transistor M2 is a low level, that is, a signal of the second electrode of the second transistor M2 is a first voltage signal with a low level. When the control signal X is a high level signal, the first transistor M1 is turned off; the second transistor M2 is turned on; and the second voltage signal Vd is transmitted to the discharge control sub-circuit 12 through the second transistor M2. At this point, the level of the second electrode of the first transistor M1 is a low level, that is, a signal of the second electrode of the first transistor M1 is a discharge indication signal with a low level.

It should be noted that in some examples, when the control signal X is a low level signal, a low voltage signal may be transmitted to the second electrode of the second transistor M2, for instance, through a transistor, so that the level of the second electrode of the second transistor M2 can be kept to be a low level. When the control signal X is a high level signal, a low voltage signal may be transmitted to the second electrode of the first transistor M1, for instance, through a transistor, so that the level of the second electrode of the first transistor M can be maintained to be a low level.

For instance, the type of the first transistor M1 and the type of the second transistor M2 may also be the same. As shown in FIG. 5B, in another example, the switch element may further include a first phase inverter 111, and the first transistor M1 and the second transistor M2 both are N-type transistors. An input end of the first phase inverter 111 is configured to receive the control signal X, and an output end of the first phase inverter 111 may be electrically connected with the control electrode of the first transistor M1.

When the control signal X is a low level signal, the control electrode of the second transistor M2 receives the control signal X with a low level, so that the second transistor M2 can be turned off; and the first phase inverter 111 converts the low level signal into a high level signal which is then transmitted to the control electrode of the first transistor M1, so that the first transistor M1 can be turned on. When the control signal X is a high level signal, the control electrode of the second transistor M2 receives the control signal X with a high level, so that the second transistor M2 can be turned on; and the first phase inverter 111 converts the high level signal into a low level signal which is then transmitted to the control electrode of the first transistor M1, so that the first transistor M1 can be turned off.

It should be noted that the first transistor M1 and the second transistor M2 may also be both P-type transistors, and in this case, the output end of the first phase inverter 111 is electrically connected with the control electrode of the second transistor M2.

It should be noted that in the embodiments of the present disclosure, in order to distinguish the transistors, except a gate electrode taken as the control electrode, one electrode of two electrodes is directly described as a first electrode, the other electrode of the two electrodes is directly described as the second electrode. Thus, the first electrodes and the second electrodes of all or part of the transistors in the embodiment of the present disclosure may be interchangeable as needed. For instance, as for an N-type transistor, the first electrode of the transistor may be a source electrode and the second electrode may be a drain electrode; or as for a P-type transistor, the first electrode of the transistor is a drain electrode and the second electrode is a source electrode.

Figure 6A:
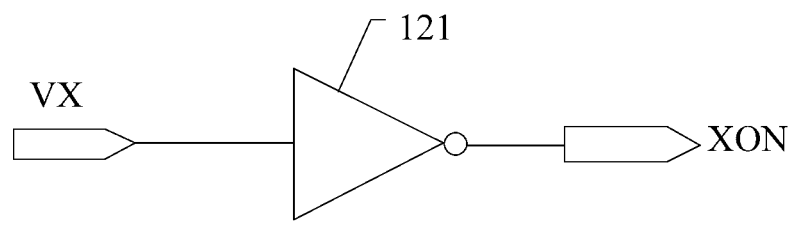
FIG. 6A is a schematic diagram of a discharge control sub-circuit according to an embodiment of the present disclosure.
Figure 6B:
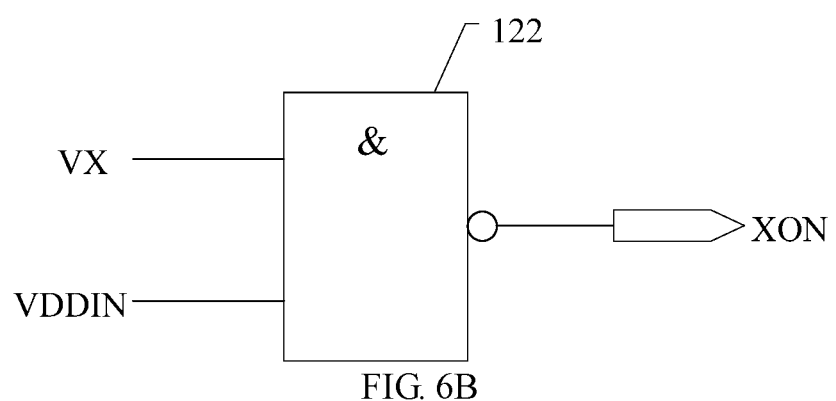
FIG. 6B is a schematic diagram of another discharge control sub-circuit according to an embodiment of the present disclosure.

FIG. 6A is a schematic diagram of a discharge control sub-circuit according to an embodiment of the present disclosure; FIG. 6B is a schematic diagram of another discharge control sub-circuit according to an embodiment of the present disclosure.

For instance, in one example, as shown in FIG. 6A, the discharge control sub-circuit 12 may include a NOT gate 121. An input end of the NOT gate 121 is configured to receive the discharge input signal VX, and an output end of the NOT gate 121 is configured to output the discharge control signal XON. For instance, the discharge control signal XON is the negation of the discharge input signal VX.

For instance, when the control signal X has the first polarity, the discharge input signal VX is the first voltage signal, and the first voltage signal is a low level signal, namely the discharge input signal VX is a low level signal. After the discharge input signal VX is converted by the NOT gate 121, the discharge control signal XON is a high level signal. When the control signal X has the second polarity, the discharge input signal VX is the second voltage signal Vd, and the second voltage signal Vd is a high level signal, namely the discharge input signal VX is a high level signal. After the discharge input signal VX is converted by the NOT gate 121, the discharge control signal XON is a low level signal.

For instance, as shown in FIG. 6B, in another example, the discharge control sub-circuit 12 may include a NAND gate 122. A first input end of the NAND gate 122 is configured to receive a logic input voltage signal VDDIN; a second input end of the NAND gate 122 is configured to receive the discharge input signal VX; and an output end of the NAND gate 122 is configured to output the discharge control signal XON.

For instance, the logic input voltage signal VDDIN is an external power supply voltage of the display device. The logic input voltage signal VDDIN may be provided by a supply voltage terminal. The logic input voltage signal VDDIN may be a high level signal.

For instance, when the control signal X has the first polarity, the discharge input signal VX is the first voltage signal, and the first voltage signal is a low level signal, namely the discharge input signal VX is a low level signal. Because the logic input voltage signal VDDIN is a high level signal, after the discharge input signal VX and the logic input voltage signal VDDIN are processed by the NAND gate 122, the discharge control signal XON is a high level signal. When the control signal X has the second polarity, the discharge input signal VX is the second voltage signal Vd, and the second voltage signal Vd is a high level signal, namely the discharge input signal VX is a high level signal. After the discharge input signal VX and the logic input voltage signal VDDIN are processed by the NAND gate 122, the discharge control signal XON is a low level signal.

For instance, when the discharge control signal XON is a high level signal, the XON function of the display device is switched off, and the display device works normally. When the discharge control signal XON is a low level signal, the XON function of the display device is switched on, and all the output ends of the gate driver of the display device output turn-on voltage signals, so as to turn on all the switch transistors on the display device. Thus, the residual charges on the pixel electrodes are released and neutralized, and the display device achieves the discharge operation.

Figure 7:
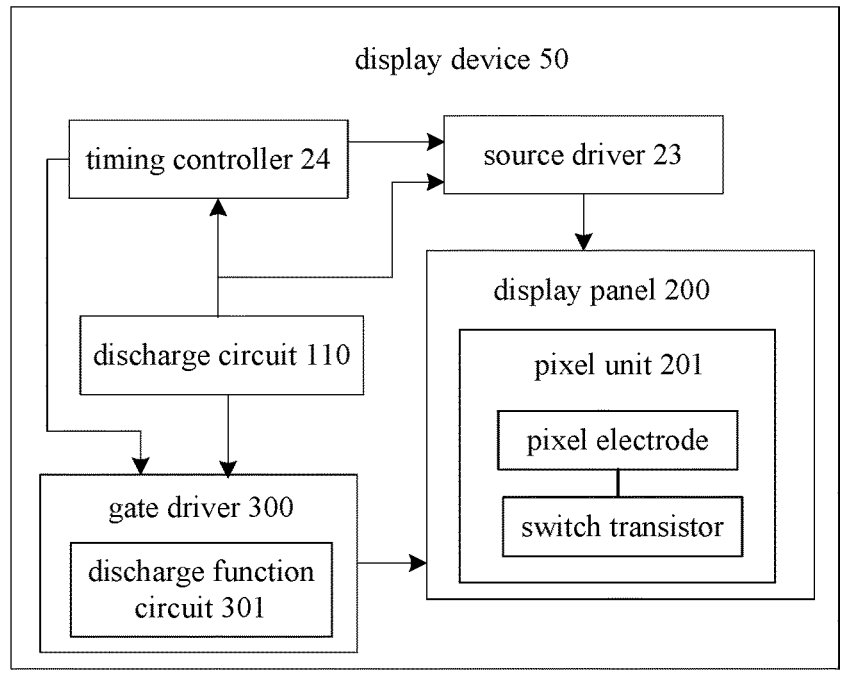
FIG. 7 is a schematic block diagram of a display device provided by an embodiment of the present disclosure.
Figure 8:
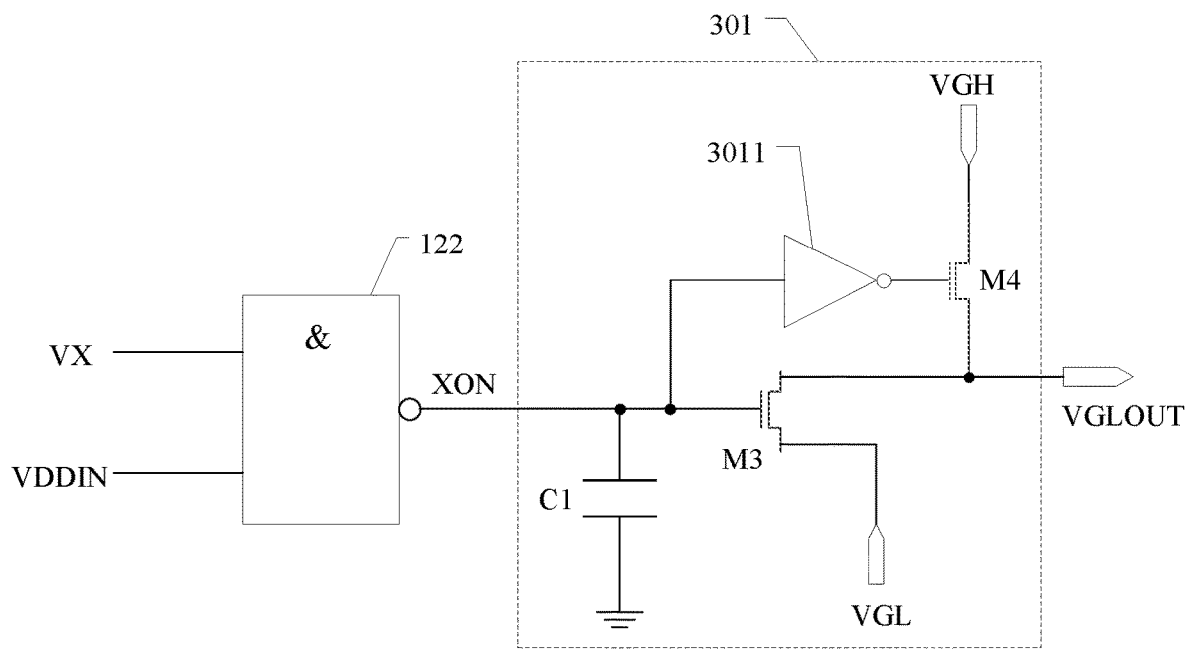
FIG. 8 is a schematic diagram of a discharge function circuit in a gate driver provided by an embodiment of the present disclosure.

FIG. 7 is a schematic block diagram of a display device provided by an embodiment of the present disclosure; FIG. 8 is a schematic diagram of a discharge function circuit in a gate driver provided by an embodiment of the present disclosure.

For instance, as shown in FIG. 7, a display device 50 provided by the embodiment of the present disclosure comprises a discharge circuit 110. The discharge circuit 110 is the discharge circuit 100 provided by any one of the foregoing embodiments. For instance, when the detection sub-circuit of the discharge circuit 110 detects that the display device 50 is in the shutdown state or the sleep state, the discharge circuit 110 can generate and output the discharge control signal, so as to switch on the XON function and control the pixel units to perform neutralizing discharge, instead of turning on the XON function only when the voltage drops to a specific value (e.g., 2V). Thus, the discharge time of the pixel units is effectively prolonged.

The display device can effectively prolong the discharge time of the pixel units, can perform the discharge operation in both the shutdown state and the sleep state, and meanwhile, can avoid the phenomenon that the transistors are turned off after being turned on, so as to effectively release the residual charges on the pixel electrodes in the pixel units and reduce or eliminate the shutdown afterimage phenomenon.

For instance, as shown in FIG. 7, the display device 50 further comprises a display panel 200 and a gate driver 300. The display panel 200 is used for displaying an image. A plurality of pixel units 201 in multiple rows and multiple columns are arranged on the display panel 200. The discharge circuit 110 is configured to generate and output the discharge control signal to the gate driver 300. The gate driver 300 is configured to output a first group of driving signals to the plurality of pixel units 201 respectively when the level of the discharge control signal is the first-type level, so as to control the plurality of pixel units 201 to perform neutralizing discharge. The gate driver 300 is also configured to output a second group of driving signals in scanning manner (for instance, the scanning manner includes progressive scanning, interlaced scanning, etc.) when the level of the discharge control signal is the second-type level, so as to control the pixel units 201 to display normally. When the control signal has the first polarity, the level of the discharge control signal is the second-type level; and when the control signal has the second polarity, the level of the discharge control signal is the first-type level. That is to say, when the control signal has the first polarity, the pixel units 201 display normally; and when the control signal has the second polarity, the pixel units 201 perform the discharge operation.

For instance, as shown in FIG. 7, each pixel unit 201 includes a pixel electrode and a switch transistor electrically connected with the pixel electrode. A plurality of switch transistors in the display panel are in one-to-one correspondence with the plurality of pixel electrodes. The gate driver 300 is configured to provide a driving signal to the control electrode of the switch transistor, so as to control the switch transistor to be turned on or off. The configuration of the pixel electrodes 201 and the switch transistors are similar to or the same with the configuration in the traditional display device known by those skilled in the art, and the present disclosure will not describe redundant portions here.

For instance, as shown in FIG. 7, the gate driver 300 may include a discharge function circuit 301. The discharge function circuit 301 is configured to receive the discharge control signal XON outputted by the discharge circuit 110, and control the gate driver 300 to time-divisionally output the first group of driving signals and the second group of driving signals according to the discharge control signal XON.

For instance, in some embodiments, as shown in FIG. 8, the discharge function circuit 301 may include a capacitor C1, a third transistor M3, a fourth transistor M4 and a second phase inverter 3011 (for instance, the second phase inverter 3011 may be a NOT gate). A first electrode of the third transistor M3 is configured to receive a turn-off voltage signal VGL of the switch transistor; a second electrode of the third transistor M3 is configured to be electrically connected with the switch transistor; and a control electrode of the third transistor M3 is configured to receive the discharge control signal XON. A first electrode of the fourth transistor M4 is configured to receive a turn-on voltage signal VGH of the switch transistor; a second electrode of the fourth transistor M4 is electrically connected with the switch transistor; a control electrode of the fourth transistor M4 is configured to be electrically connected with an output end of the second phase inverter 3011; and an input end of the second phase inverter 3011 is configured to receive the discharge control signal XON. The capacitor C1 is configured to stabilize the voltage signals of the control electrodes of the third transistor M3 and the fourth transistor M4.

When the level of the discharge control signal XON is the first-type level (e.g., a low level), the control electrode of the third transistor M3 receives the discharge control signal XON with a low level, so that the third transistor M3 can be turned off; and the second phase inverter 3011 converts the low level signal into a high level signal which is then transmitted to the control electrode of the fourth transistor M4, so that the fourth transistor M4 can be turned on. At this point, a signal VGLOUT outputted by the discharge function circuit 301 represents the first group of driving signals; the gate driver 300 outputs the first group of driving signals; and the first group of driving signals can control all the switch transistors in the display device 50 to be turned on, so as to control the residual charges on the pixel electrodes in the pixel units to be released, thereby implementing the discharge operation.

When the level of the discharge control signal XON is the second-type level (e.g., a high level), the control electrode of the third transistor M3 receives the discharge control signal XON with a high level, so that the third transistor M3 can be turned on; and the second phase inverter 3011 converts the high level signal into a low level signal which is then transmitted to the control electrode of the fourth transistor M4, so that the fourth transistor M4 can be turned off. At this point, the signal VGLOUT outputted by the discharge function circuit 301 represents the second group of driving signals, namely the gate driver 300 outputs the second group of driving signals; and the second group of driving signals can control all the switch transistors in the display device 50 to work normally, so as to control the display device 50 to display normally.

For instance, respective driving signals in the first group of driving signals all are turn-on voltage signals VGH of the switch transistors, so as to control the switch transistors in all the pixel units 201 of the display panel 200 to be all in the turn-on state, and then the pixel units perform the discharge operation. The second group of driving signals may simultaneously include the turn-on voltage signals VGH and the turn-off voltage signals VGL of the switch transistors. For instance, the preset scanning manner of the display device 50 is progressive scanning. When the discharge control signal XON is a high level signal, at a certain scanning moment, only one output end of the gate driver 300 outputs the turn-on voltage signal VGH, so as to control the switch transistors in one row of pixel units 201 to be in the turn-on state, and the remaining output ends output the turn-off voltage signals VGL, thereby controlling the switch transistors in the remaining rows of pixel units 201 to be in the turn-off state. Thus, progressive scanning operation is implemented, and the pixel units 201 display normally. That is to say, at a certain scanning moment, the second group of driving signals may include one turn-on voltage signal VGH and a plurality of turn-off voltage signals VGL. But the present disclosure is not limited thereto, the number of the turn-on voltage signals VGH and the number of the turn-off voltage signals VGL in the second group of driving signals may be determined according to the preset scanning manner of the display device 50. No specific limitation will be given here in the present disclosure.

For instance, the third transistor M3 and the fourth transistor M4 both are thin film transistors (TFTs), field-effect transistors (FETs) or other switching elements having the same characteristics.

For instance, a type of the third transistor M3 and a type of the fourth transistor M4 may be the same. For instance, in the example as shown in FIG. 8, both the third transistor M3 and the fourth transistor M4 are N-type transistors. But the present disclosure is not limited thereto, the type of the third transistor M3 and the type of the fourth transistor M4 may also be opposite.

For instance, the switch transistor also may be a thin film transistor, a field-effect transistor or other switching elements having the same characteristics.

For instance, as shown in FIG. 7, the display device 50 further comprises a source driver 23 and/or a timing controller 24. The source driver 23 and/or the timing controller 24 both are connected with the discharge circuit 110. When the control signal has the first polarity, the discharge circuit 100 is configured to, for instance, output the second voltage signal to the source driver 23 and/or the timing controller 24, so as to control the source driver 23 and/or the timing controller 24 to work normally. For instance, the source driver 23 is configured to receive the second voltage signal Vd transmitted from the discharge circuit 100, and provide the second voltage signal Vd to the display panel 200, so as to control the plurality of pixel units 201 in the display panel 200 to display an image. When the control signal has the second polarity, the discharge circuit 110 is configured to output a discharge indication signal to the source driver 23 and/or the timing controller 24, so as to control the source driver 23 and/or the timing controller 24 to stop working. The timing controller 24 is also connected with the gate driver 300 and the source driver 23, and the timing controller 24 is configured to provide a control command and/or a timing signal to the gate driver 300 and/or the source driver 23, so that the gate driver 300 and/or the source driver 23 can work cooperatively. It should be noted that relevant structures and functions of the source driver 23 and the timing controller 24 are similar to or the same with the structures and the functions of the source driver and the timing controller in the conventional display device known by those skilled in the art, and repeated portions will be omitted in the present disclosure.

For instance, the discharge circuit 110 may also be connected with a system power supply.

For instance, the display panel 200 may be a liquid crystal display panel, an organic light-emitting diode display panel, or the like.

For instance, the display panel 200 may be a rectangular panel, a circular panel, an elliptical panel, a polygonal panel, etc. In addition, the display panel 200 not only may be a flat panel but also may be a curved panel, or even a spherical panel.

For instance, the display panel 200 may also have a touch function, namely the display panel 200 may be a touch display panel.

For instance, the source driver 23 and the gate driver 300 may be implemented by respective application-specific integrated circuit (ASIC) chips respectively or by being directly manufactured on the display panel 200 by a semiconductor manufacturing process.

For instance, the display device 50 can be a mobile phone, a tablet, a television, a monitor, a notebook computer, a digital photo frame, a navigator, or any products or components having a display function.

Figure 9:
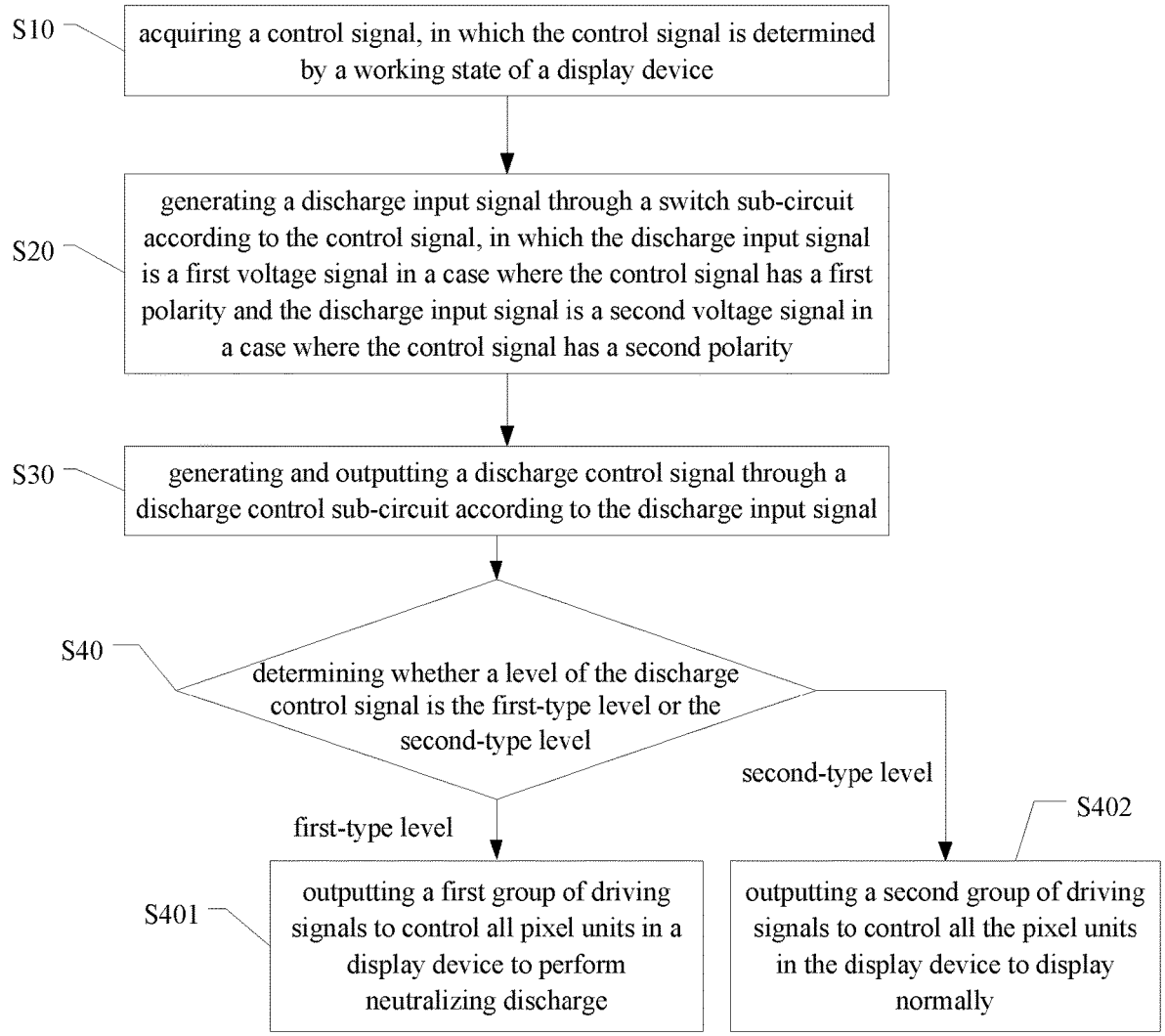
FIG. 9 is a schematic flowchart of a discharge method provided by an embodiment of the present disclosure.

FIG. 9 is a schematic flowchart of a discharge method provided by an embodiment of the present disclosure.

For instance, as shown in FIG. 9, the discharge method provided by the embodiment of the present disclosure may comprise following steps:

S10: acquiring a control signal, in which the control signal is determined by a working state of a display device;

S20: generating a discharge input signal through a switch sub-circuit according to the control signal, in which the discharge input signal is a first voltage signal in a case where the control signal has a first polarity and the discharge input signal is a second voltage signal in a case where the control signal has a second polarity; and S30: generating and outputting a discharge control signal through a discharge control sub-circuit according to the discharge input signal.

For instance, in the step S10, acquiring the control signal includes: detecting the working state of the display device, and generating the control signal according to the working state of the display device.

For instance, in the step S10, the working state of the display device includes a shutdown state, a sleep state and a display state. In the display state, the control signal has the first polarity; and in the shutdown state and in the sleep state, the control signal has the second polarity.

For instance, in the step S20, when the control signal has the first polarity, a level of the control signal is a first-type level (e.g., a low level), and a level of the first voltage signal is the first-type level (e.g., a low level), namely a level of the discharge input signal is the first-type level (e.g., a low level). When the control signal has second polarity, the level of the control signal is a second-type level (e.g., a high level), and a level of the second voltage signal is the second-type level (e.g., a high level), namely the level of the discharge input signal is the second-type level (e.g., a high level).

For instance, in the step S20, the discharge method further comprises: controlling a timing controller and/or a source driver to stop working in a case where the control signal has the second polarity.

For instance, in the step S20, the discharge method further comprises: outputting the second voltage signal to the timing controller and/or the source driver in the case where the control signal has the first polarity, so as to control the timing controller and/or the source driver to work normally.

For instance, in the step S30, generating and outputting the discharge control signal through the discharge control sub-circuit according to the discharge input signal includes: obtaining the discharge control signal by inverting the discharge input signal.

It should be noted that the specific structures, functions and the like of the switch sub-circuit and the discharge sub-circuit may be referred to relevant descriptions in the embodiment of the discharge circuit, and details are not described herein again.

For instance, when the control signal has the first polarity, a level of the first voltage signal is the first-type level, namely the level of the discharge input signal is the first-type level (e.g., a low level), and a level of the discharge control signal obtained by inverting the discharge input signal is the second-type level (e.g., a high level). When the control signal has the second polarity, a level of the second voltage signal is the second-type level, namely the level of the discharge input signal is the second-type level (e.g., high level), and the level of the discharge control signal obtained by inverting the discharge input signal is the first-type level (e.g., a low level).

For instance, when the level of the discharge control signal is the second-type level (e.g., a high level), the XON function of the display device is switched off, and the display device works normally. When the level of the discharge control signal is the first-type level (e.g., a low level), the XON function of the display device is switched on, so the residual charges on the pixel electrodes are released and neutralized, and then the display device achieves the discharge operation.

It should be noted that the specific operation process of the step S10 may be referred to the working process of the detection sub-circuit in the embodiment of the discharge circuit; the specific operation process of the step S20 may be referred to the working process of the switch sub-circuit in the embodiment of the discharge circuit; and the specific operation process of the step S30 may be referred to the working process of the discharge control sub-circuit in the embodiment of the discharge circuit, and the repeated portions will not be described herein again.

For instance, as shown in FIG. 9, the discharge method further comprises:

S40: determining whether a level of the discharge control signal is the first-type level (e.g., a low level) or the second-type level (e.g., a high level).

When the level of the discharge control signal is the first-type level (e.g., a low level), the step S401 is performed: outputting a first group of driving signals to control all pixel units in a display device to perform neutralizing discharge.

When the level of the discharge control signal is the second-type level (e.g., a high level), the step S402 is performed: outputting a second group of driving signals to control all the pixel units in the display device to display normally.

It should be noted that the specific operation processes of the steps S40, S401 and S402 may be referred to the working process of the gate driver 300 in the embodiment of the display device and the repeated portions will not be described herein again.

For the present disclosure, the following statements should be noted:

(1) The accompanying drawings involve only the structure(s) in connection with the embodiment(s) of the present disclosure, and other structure(s) can be referred to common design(s);

(2) For the purpose of clarity only, in accompanying drawings for illustrating the embodiment(s) of the present disclosure, the thickness of a layer or an area may be enlarged or narrowed, that is, the drawings are not drawn in a real scale;

(3) In case of no conflict, the embodiments of the present disclosure and the features in one embodiment can be combined with each other to obtain new embodiments.

What have been described above are only specific implementations of the present disclosure, the protection scope of the present disclosure is not limited thereto, and the protection scope of the present disclosure should be based on the protection scope of the claims.

What is claimed is:

1. A discharge circuit, comprising: a switch sub-circuit and a discharge control sub-circuit,
 wherein the switch sub-circuit is configured to:
  receive a control signal, wherein the control signal is determined by a working state of a display device,
  output a first voltage signal as a discharge input signal in a case where the control signal has a first polarity, and
  output a second voltage signal as the discharge input signal in a case where the control signal has a second polarity; and
 the discharge control sub-circuit is electrically connected with the switch sub-circuit and is configured to:
  receive the discharge input signal from the switch sub-circuit, and
  generate and output a discharge control signal according to the discharge input signal.

2. The discharge circuit according to claim 1, further comprising a detection sub-circuit,
 wherein the detection sub-circuit is configured to detect the working state of the display device, and generate and output the control signal according to the working state of the display device.

3. The discharge circuit according to claim 1, wherein the switch sub-circuit comprises a first output end and a second output end; the discharge control sub-circuit is electrically connected with the second output end of the switch sub-circuit;
 in the case where the control signal has the first polarity, the switch sub-circuit is in a first switch state, and the second output end of the switch sub-circuit outputs the first voltage signal as the discharge input signal; and
 in the case where the control signal has the second polarity, the switch sub-circuit is in a second switch state, and the second output end of the switch sub-circuit outputs the second voltage signal as the discharge input signal.

4. The discharge circuit according to claim 3, wherein
 in the case where the control signal has the first polarity, the switch sub-circuit is further configured to output the first voltage signal to the discharge control sub-circuit, and
 in the case where the control signal has the second polarity, the switch sub-circuit is configured to output the second voltage signal to the discharge control sub-circuit and is also configured to control a timing controller and/or a source driver to stop working; and
 a level of the first voltage signal is a first-type level, and a level of the second voltage signal is a second-type level.

5. The discharge circuit according to claim 4, wherein in the case where the control signal has the first polarity, the switch sub-circuit is also configured to output the second voltage signal to the timing controller and/or the source driver through the first output end.

6. The discharge circuit according to claim 3, wherein the switch sub-circuit comprises a switch element; the switch element comprises a control end, an input end, the first output end and the second output end;
 the control end of the switch element is configured to receive the control signal; the input end of the switch element is configured to receive the second voltage signal; the first output end of the switch element is electrically connected with the timing controller and/or the source driver;
 in the case where the control signal has the first polarity, the switch element electrically connects the input end and the first output end under control of the control signal; and
 in the case where the control signal has the second polarity, the switch element electrically connects the input end and the second output end under the control of the control signal.

7. The discharge circuit according to claim 6, wherein the switch element is a relay element, the relay element comprises a moving contact, a first stationary contact and a second stationary contact;
 the moving contact is the input end of the switch element; the first stationary contact is the first output end of the switch element; and the second stationary contact is the second output end of the switch element.

8. The discharge circuit according to claim 1, wherein the discharge control sub-circuit comprises a NOT gate;
 an input end of the NOT gate is configured to receive the discharge input signal, and an output end of the NOT gate is configured to output the discharge control signal.

9. The discharge circuit according to claim 1, wherein the discharge control sub-circuit comprises a NAND gate;
 a first input end of the NAND gate is configured to receive a logic input voltage signal, a second input end of the NAND gate is configured to receive the discharge input signal, and an output end of the NAND gate is configured to output the discharge control signal.

10. The discharge circuit according to claim 2, wherein the working state of the display device comprises a shutdown state, a sleep state and a display state;
 in the display state, the detection sub-circuit is configured to generate and output the control signal having the first polarity; and
 in the shutdown state and the sleep state, the detection sub-circuit is configured to generate and output the control signal having the second polarity.

11. A display device, comprising the discharge circuit according to claim 1.

12. The display device according to claim 11, further comprising a display panel and a gate driver,
 wherein the display panel comprises a plurality of pixel units;
 the discharge circuit is configured to generate and output the discharge control signal to the gate driver; and
 the gate driver is configured to output a first group of driving signals to the plurality of pixel units respectively in a case where a level of the discharge control signal is a first-type level, so as to control the plurality of pixel units to perform neutralizing discharge.

13. The display device according to claim 12, wherein the gate driver is further configured to output a second group of driving signals in scanning manner in a case where the level of the discharge control signal is a second-type level, so as to control the plurality of pixel units to display normally.

14. The display device according to claim 12, further comprising a timing controller and/or a source driver, wherein the timing controller and/or the source driver is connected with the discharge circuit;

in the case where the control signal has the first polarity, the discharge circuit is configured to control the timing controller and/or the source driver to work normally; and in the case where the control signal has the second polarity, the discharge circuit is configured to control the timing controller and/or the source driver to stop working.

15. A discharge method, comprising:

acquiring a control signal, wherein the control signal is determined by a working state of a display device;

generating a discharge input signal through a switch sub-circuit according to the control signal, wherein the discharge input signal is a first voltage signal in a case where the control signal has a first polarity and the discharge input signal is a second voltage signal in a case where the control signal has a second polarity; and generating and outputting a discharge control signal through a discharge control sub-circuit according to the discharge input signal.

16. The discharge method according to claim 15, wherein acquiring the control signal comprises:

detecting the working state of the display device, and generating the control signal according to the working state of the display device.

17. The discharge method according to claim 15, further comprising: controlling a timing controller and/or a source driver to stop working in the case where the control signal has the second polarity.

18. The discharge method according to claim 17, further comprising: outputting the second voltage signal to the timing controller and/or the source driver in the case where the control signal has the first polarity, wherein in the case where the control signal has the first polarity, a level of the first voltage signal is a first-type level, and a level of the discharge control signal is a second-type level; and in the case where the control signal has the second polarity, a level of the second voltage signal is the second-type level, and the level of the discharge control signal is the first-type level.

19. The discharge method according to claim 15, wherein generating and outputting the discharge control signal through the discharge control sub-circuit according to the discharge input signal comprise:

obtaining the discharge control signal by inverting the discharge input signal.

20. The discharge method according to claim 19, further comprising:

determining whether a level of the discharge control signal is a first-type level or a second-type level;

outputting a first group of driving signals to control all pixel units in a display device to perform neutralizing discharge in a case where the level of the discharge control signal is the first-type level; and outputting a second group of driving signals to control all the pixel units in the display device to display normally in a case where the level of the discharge control signal is the second-type level.

* * * * *